United States Patent
Memmen et al.

(10) Patent No.: US 7,216,428 B2
(45) Date of Patent: May 15, 2007

(54) METHOD FOR TURBINE ELEMENT REPAIRING

(75) Inventors: Robert L. Memmen, Cheshire, CT (US); James W. Neal, Ellington, CT (US)

(73) Assignee: United Technologies Corporation, Hartford, CT (US)

( * ) Notice: Subject to any disclaimer, the term of this patent is extended or adjusted under 35 U.S.C. 154(b) by 335 days.

(21) Appl. No.: 10/635,694

(22) Filed: Aug. 5, 2003

(65) Prior Publication Data

US 2004/0172825 A1 Sep. 9, 2004

Related U.S. Application Data

(63) Continuation-in-part of application No. 10/377,954, filed on Mar. 3, 2003.

(51) Int. Cl.
*B23P 6/00* (2006.01)
*B23P 19/04* (2006.01)

(52) U.S. Cl. ............... 29/889.1; 29/402.01; 29/402.09; 29/402.13; 29/402.16; 29/402.18

(58) Field of Classification Search ......... 29/889.1, 29/402.01, 402.09, 402.11, 402.13, 402.16, 29/402.18
See application file for complete search history.

(56) References Cited

U.S. PATENT DOCUMENTS

| | | | |
|---|---|---|---|
| 0,763,229 A | | 6/1904 | Watson |
| 3,574,924 A | * | 4/1971 | Dibble .................... 228/119 |
| 4,822,248 A | | 4/1989 | Wertz et al. |
| 5,038,014 A | * | 8/1991 | Pratt et al. .............. 219/121.64 |
| 5,111,570 A | * | 5/1992 | Baumgarten et al. ..... 29/402.13 |
| 5,451,142 A | | 9/1995 | Cetel et al. |
| 5,525,429 A | | 6/1996 | Mannava et al. |
| 5,732,467 A | | 3/1998 | White et al. |
| 5,783,318 A | | 7/1998 | Biondo et al. |
| 5,846,608 A | | 12/1998 | Neumann et al. |
| 6,049,978 A | | 4/2000 | Arnold |
| 6,302,625 B1 | | 10/2001 | Carey et al. |
| 6,339,878 B1 | | 1/2002 | Owen et al. |
| 6,427,327 B1 | * | 8/2002 | Bunker ..................... 29/889.1 |
| 6,605,160 B2 | | 8/2003 | Hoskin |
| 6,754,955 B1 | * | 6/2004 | Carl et al. ................ 29/889.1 |
| 6,787,740 B2 | | 9/2004 | Smith et al. |
| 2002/0076573 A1 | | 6/2002 | Neal et al. |
| 2003/0056716 A1 | | 3/2003 | Johnson |
| 2004/0172825 A1 | | 9/2004 | Memmen et al. |

FOREIGN PATENT DOCUMENTS

| | | |
|---|---|---|
| EP | 0905274 A1 | 3/1999 |
| EP | 1325969 A2 | 7/2003 |

(Continued)

OTHER PUBLICATIONS

Duane G. Williams, Vacuum Coating with a Hollow Cathode Source, J. Vac. Sci. Technol., Jan.-Feb., 1974, New York.

(Continued)

*Primary Examiner*—John C. Hong
(74) *Attorney, Agent, or Firm*—Bachman & LaPointe, P.C.

(57) ABSTRACT

Physical vapor deposition is utilized to deposit repair material on Ti alloy turbine components.

22 Claims, 2 Drawing Sheets

FOREIGN PATENT DOCUMENTS

| | | |
|---|---|---|
| UA | 52740 | 5/2001 |
| WO | 03/028428 A2 | 4/2003 |

OTHER PUBLICATIONS

Patent Abstracts of Japan, vol. 122, No. 2, Jun. 10, 1988 - JP 63004066 (Hitachi Ltd.).

J.R. Treglio et al., Deposition of TiB2 at Low Temperature with Low Residual Stress Vacuum Arc Plasma Source, Surface and Coatings Technology, Dec. 3, 1993, Elsevier Sequoia SA, Switzerland.

B.A. Movchan, EB-PVD Technology in the Gas Turbine Industry: Present and Future, JOM, Nov. 1996, pp. 40-44.

European Search Report for EP Patent Application No. 04254725.7.

* cited by examiner

METHOD FOR TURBINE ELEMENT REPAIRING

CROSS-REFERENCE TO RELATED APPLICATION

This is a Continuation-in-Part of Ser. No. 10/377,954, filed Mar. 3, 2003, and entitled "Fan and Compressor Blade Dovetail Restoration Process". Ser. No. 10/334,019 is incorporated herein by reference as if set forth at length.

BACKGROUND OF THE INVENTION (1) Field of the Invention

The invention relates to the restoration of turbine elements. More particularly, the invention relates to the restoration of worn or damaged gas turbine engine fan blades and compressor blades and vanes.

(2) Description of the Related Art

The components of gas turbine engines are subject to wear and damage. Even moderate wear and damage of certain components may interfere with proper operation of the engine. Particular areas of concern involve the airfoils of various blades and vanes. Wear and damage may interfere with their aerodynamic efficiency, produce dynamic force imbalances, and even structurally compromise the worn/damaged parts in more extreme cases. A limited reconditioning is commonly practiced for slightly worn or damaged airfoils wherein additional material is removed yet further below the wear/damage to provide the airfoil with a relatively efficient and clean sectional profile albeit smaller than the original or prior profile. Exemplary inspection criteria establishing the limits to which such reconditioning can be made are shown in Pratt & Whitney JT8D Engine Manual (P/N 773128), ATA 72-33-21, Inspection—01,United technologies Corp., East Hartford Conn. Such limits may differ among airfoils depending upon the location and particular application. The limits are based on structural and performance considerations which limit the amount of material that may be removed.

Various techniques have been proposed for more extensive restoration of worn or damaged components of gas turbine engines. U.S. Pat. No. 4,822,248 discloses use of a plasma torch to deposit nickel- or cobalt-based superalloy material. U.S. Pat. No. 5,732,467 identifies the use of high velocity oxy-fuel (HVOF) and low pressure plasma spray (LPPS) techniques for repairing cracks in such turbine elements. U.S. Pat. No. 5,783,318 also identifies LPPS techniques in addition to laser welding and plasma transferred arc welding. U.S. Pat. No. 6,049,978 identifies further use of HVOF techniques. Such techniques have offered a limited ability to build up replacement material to restore an original or near original cross-section. However, the structural properties of the replacement material may be substantially limited relative to those of the base material.

Especially for larger damage, it is known to use preformed inserts which may be welded in place to repair damage. With such inserts, the damaged area is cut away to the predetermined shape of the insert which is, in turn, welded in place. Structural limits associated with the welding limit the capability of such repair techniques to relatively low stress regions of the airfoil as with other techniques. It is common for engine repair manuals to specify the low stress areas where weld repair is permissible. Thus substantial combinations of the extent of the wear/damage and the stress to which the worn/damaged area is subject may limit use of such techniques. High stress areas often include areas near (especially inboard of) a midspan shroud of a fan blade.

SUMMARY OF THE INVENTION

Accordingly, one aspect of the invention involves a method for restoring a Ti alloy component which has lost first material from a damage site. Additional material may be removed at least partially from the damage site to create a base surface. A Ti-based material is physically deposited atop the base surface at least partially in place of the first material and the additional material.

In various implementations, the Ti-based material may be Ti-6Al-4V, Ti-6Al-2Sn-4Zr-2Mo or Ti-8Al-1V-1Mo and may be essentially identical to the base Ti alloy of the component. The removing of additional material may be, in major part, from undamaged portions of the component. The deposited material may, in major part, essentially, or totally replace the first and additional material. The component may be a blade having a root and an airfoil and the damage site may be along a leading edge of the airfoil inboard of a midspan shroud of the airfoil. The damage site may be inboard of the midspan shroud by an exemplary no more than 15% of a span of the airfoil. The damage site may be located between 30% of such span inboard of the midspan shroud and 20% of such span outboard of the midspan shroud. Such inboard and outboard limits may, more narrowly, be 20% and 10%. The first material may be lost to a depth of at least 2.0 mm. The method may further involve applying a backing element to the component protruding adjacent the damage site after the removal so that the deposited metal builds up on the base surface and backing element. The method may further involve at least partially removing the backing element and machining adjacent deposited material and preexisting material of the component to create a second base surface. More of the metal may then be physically deposited atop the second base surface. The depositing may include vapor deposition, electron beam physical vapor deposition, and electron beam flash vapor deposition.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
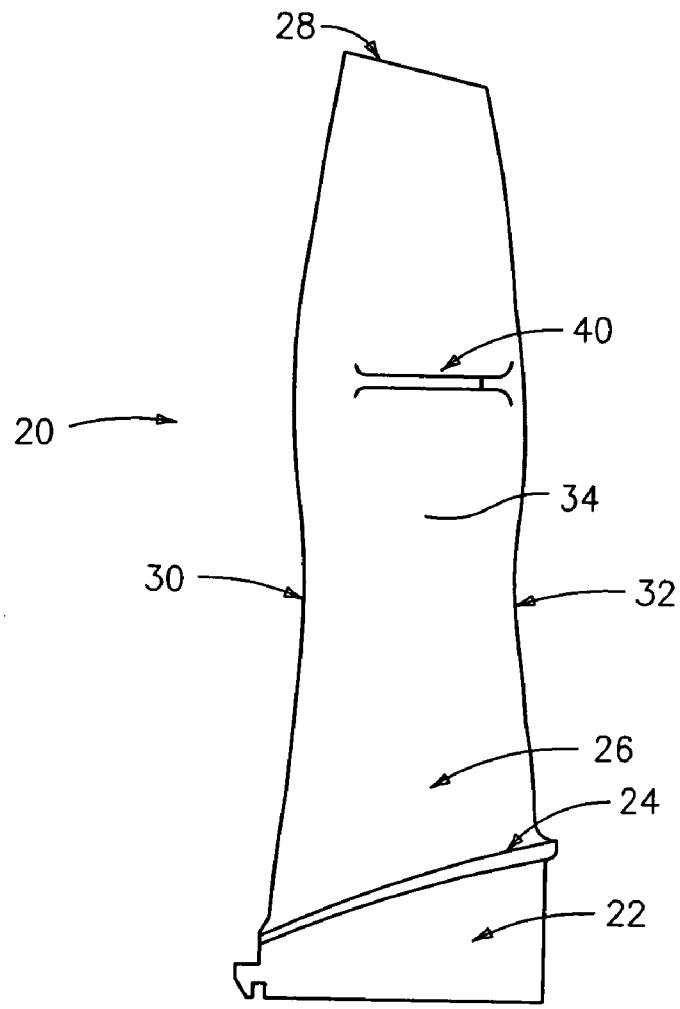
FIG. 1 is a view of an airfoil of a fan of a gas turbine engine.
Figure 2:
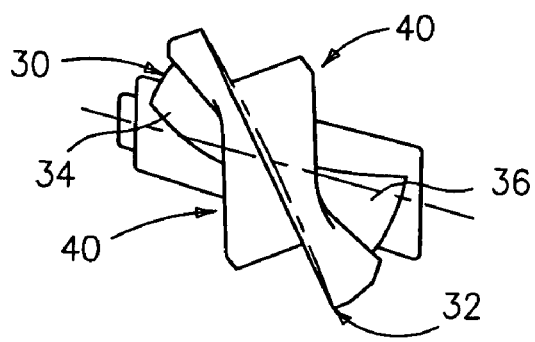
FIG. 2 is a tip-inward view of the airfoil of FIG. 1.

FIG. 1 shows a fan blade 20 from a gas turbine engine. The blade has an inboard blade root 22 configured for attaching the blade to a disk (not shown). A platform 24 separates the blade root from an airfoil 26 extending from the platform to a tip 28. The airfoil has a leading edge 30 and a trailing edge 32 with suction and pressure sides 34 and 36 extending therebetween. In the exemplary blade, in an intermediate location along the span between the platform and tip, a midspan damper shroud projection 40 extends from each of the pressure and suction side surfaces.

The pressure and suction side projections 40 may respectively interact with the suction and pressure side projections of the adjacent blades to damp blade oscillation. The rotating mass of the midspan shroud projections along with forces from their interaction with adjacent projections subjects the blade to high stresses in areas proximate and inboard of these projections. These stresses may limit repairability of these areas relative to other less-stressed areas. It has been discovered that electron beam physical vapor deposition (EBPVD) may be used to deposit repair material with low residual stress and with properties substantially the same as the underlying base material. The deposited material may have enhanced strength and enhanced adhesion to the base material relative to welding repair techniques. The deposition advantageously occurs in the absence of a transient liquid phase, with solidification directly from the vapor cloud.

Figure 3:
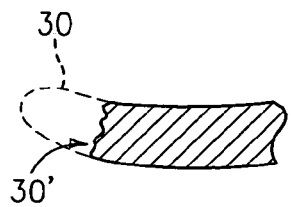
FIG. 3 is a partial sectional view of the airfoil of FIG. 1 upon damage.
Figure 4:
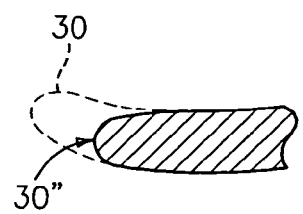
FIG. 4 is a partial sectional view of the airfoil of FIG. 1 upon wear.
Figure 5:
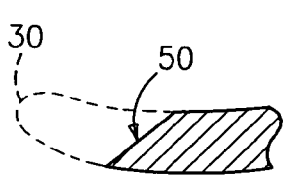
FIG. 5 is a partial sectional view of the airfoil of FIG. 1 after machining to remove damaged/worn surfaces.
Figure 6:
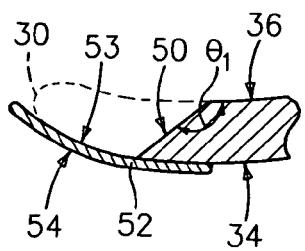
FIG. 6 is a partial sectional view of the airfoil of FIG. 5 after the application of a backing element.
Figure 7:
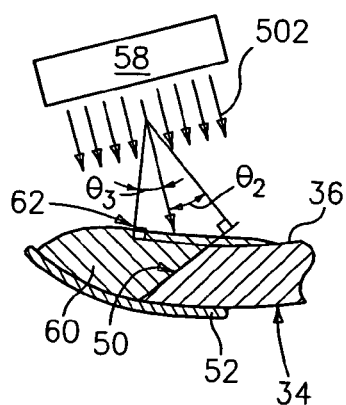
FIG. 7 is a partial sectional view of the airfoil of FIG. 6 after deposition of initial material to rebuild the airfoil.
Figure 8:
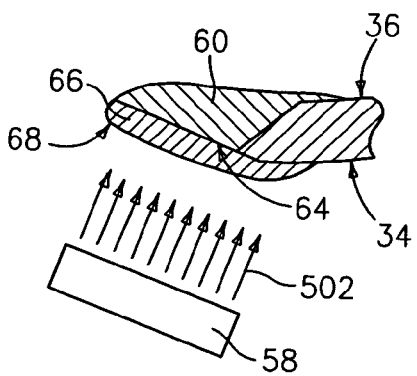
FIG. 8 is a partial sectional view of the airfoil of FIG. 7 after further machining and deposition of additional material to rebuild the airfoil

FIG. 3 shows localized damage such as is associated with foreign object damage (FOD) nicking or chipping the airfoil proximate the leading edge to create a damaged leading portion 30'. FIG. 4 shows more general damage such as a leading edge eroded to a location 30". The damage site is advantageously cleaned of contamination Further removal of base material may provide an advantageous base surface for receiving deposition. In the exemplary restoration procedure, after the damage/wear, the remaining base material of the blade is ground to a preset configuration such as providing an angled leading facet or base surface 50 (FIG. 5). The facet is shown at an included angle $\theta_1$ to the concave pressure side surface 36. Exemplary $\theta_1$ are over 120°, more narrowly, 120°–130°. The position/orientation of the facet 50 may depend on a number of factors and may be fixed based upon the location of the damage so that, in a given repair facility, any damage at a given point on the airfoil will result in similar machining.

In an optional illustrated variation, a backing scaffold/mask element 52 is secured to the airfoil projecting beyond the facet 50 adjacent to the location of the lost/removed material. In the exemplary embodiment, the backing element 52 may be a metallic (e.g., aluminum) tape having first and second surfaces 53 and 54, a trailing portion of the first surface 53 being secured to a remaining intact leading portion of the suction side surface 34. A forward portion of the surface 53 protrudes beyond the lost leading edge 30 and an intermediate portion extends aligned with a lost portion of the surface 34 along the original contour of the airfoil. In optional variations, the surface 53 may extend fully or partially to either side of alignment with the lost original surface contour.

The blade may then be positioned relative to a vapor source 58 emitting vapors along line of sight paths 502. Advantageously the source/paths are oriented so that the paths are within slight angles $\theta_2$ and $\theta_3$ off perpendicular to the surfaces 50 and 36. Exemplary $\theta_2$ and $\theta_3$ are less than 30°. Deposition from the source 58 builds up a first repair material 60. This is advantageously built up to a surface contour 62 beyond the pressure side portion of the lost original contour of the airfoil. Curvature of the surface 36 produces associated change in $\theta_3$ along the deposition-receiving portion of such surface adjacent the base surface 50.

Figure 9:
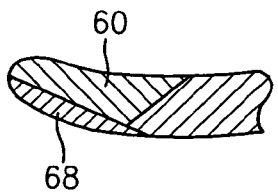
FIG. 9 is a view of the airfoil of FIG. 8 after further machining.

After this deposition stage, the blade may be further machined to remove the backing element 52 and create a second facet or base surface 64 extending along the deposited material 60 and the original base material. In the exemplary embodiment, this machining process further removes a previously intact leading portion of the suction side surface 34. The blade may be reoriented relative to the source 58 so that the surfaces 64 and 34 are just slightly off perpendicular to the paths 502 and a second additional material 66 deposited thereatop to reach a contour 68 beyond the suction side portion of the lost original contour. The deposited materials 60 and 66 may then be machined down to a specified final contour advantageously identical to the lost original contour (FIG. 9). Thereafter, additional surface treatments and/or protective coatings may be applied.

The exemplary restoration material is Ti-6Al-4V deposited by an EBPVD or an ion-enhanced EBPVD process. The EBPVD process is believed to provide advantageous physical properties via deposition in the absence of a transient liquid phase. EBPVD is believed to have lower residual stress and better adhesion than other processes such as plasma spray deposition. The exemplary deposition is performed in a vacuum chamber at a pressure between $10^{-3}$ and $10^{-6}$ torr, more narrowly, approximately $10^{-4}$ torr. The exemplary deposition rates are between 10 and 50 micrometers per minute, more narrowly, approximately 20 micrometers per minute. The localized deposition may build up to essentially any depth in one or more stages, the separate stages being characterized by some combination of intervening machining or repositioning of the component relative to the ion source. Individual stages may well deposit material to depths over 2 mm, over 5 mm, or even more. For particularly expensive components, the process could be utilized to completely replace lost features. For example, if a blade is broken off of a unitary disk and blade ring, a replacement blade may be built up from the disk.

The same procedure may be used to restore material to the trailing edge of the airfoil or to the leading or trailing edges of the midspan shroud or to tip regions, even where lost material has exceeded traditional repair limits. Similar deposition could effect repairs on the suction or pressure side surfaces more remote from the edges. For such repairs, single deposition stages would typically be sufficient. On a convex surface (e.g., of the suction side), a relatively flat facet machining could be particularly convenient. On a concave surface (e.g., of the pressure side) a concave machining (e.g., with a doubly convex grinding quill) may be appropriate. Advantageously, with such concave machining the machined surface remains within the desired angle of normal to the vapor paths along its entire area.

Machining other than the flat-facet grinding may be utilized. The most important element of effective machining is providing a clean base surface for subsequent deposition. Although advantageously smooth, a desired or acceptable level of roughness may be provided. Advantageously, the blade remains stationary during each deposition stage so as to limit the presence of columnar discontinuities in the deposited material.

One or more embodiments of the present invention have been described. Nevertheless, it will be understood that various modifications may be made without departing from the spirit and scope of the invention. For example, although particularly useful with blades having midspan shrouds, the methods may be applied to other blades and other turbine components and non-turbine components. Details of the particular turbine engine component or other piece and the particular wear or damage suffered may influence details of any given restoration. Accordingly, other embodiments are within the scope of the following claims.

What is claimed is:

1. A method for restoring a Ti alloy turbine component which has lost first material from a damage site comprising:
    applying a backing element to the component, the backing element having a first face and the applying placing a first portion of the first face along the component with a second portion of the first face protruding adjacent the damage site; and
    physically depositing a Ti-based material at least partially in place of the first material so that said Ti-based material builds up on the component and the second portion of said first face.

2. The method of claim 1 wherein:
    the method further comprises removing additional material, before said applying, at least partially from the damage site to create a base surface; and
    the physically depositing deposits said Ti-based material atop the base surface at least partially in place of the first material and the additional material.

3. The method of claim 2 wherein the removing of additional material is, in major part, from undamaged portions of the component.

4. The method of claim 2 wherein:
    the depositing is along a vapor line path less than 30° off normal to the base surface.

5. The method of claim 1 wherein:
    said deposited Ti-based material in major part replaces said first material.

6. The method of claim 1 wherein said Ti-based material is selected from the group consisting of Ti-6Al-4V, Ti-6Al-2Sn-4Zr-2Mo, and Ti-8Al-1V-1Mo.

7. The method of claim 1 wherein the component is a blade having a root and an airfoil and the damage site is along a leading edge of the airfoil inboard of a midspan shroud of the airfoil.

8. The method of claim 7 wherein the damage site inboard of the midspan shroud by no more than 15% of a span of the airfoil.

9. The method of claim 7 wherein the first material is lost to a depth of at least 2.0 mm.

10. The method of claim 1 wherein the component is a blade having a root and an airfoil and the damage site is along a leading edge of the airfoil between 20% of an airfoil span inboard of a midspan shroud of the airfoil and 10% of said span outboard of said midspan shroud.

11. The method of claim 1 wherein the component is a blade having a root and an airfoil and the damage site is along a leading edge of the airfoil between 30% of said span inboard of a midspan shroud of the airfoil and 20% of said span outboard of said midspan shroud.

12. The method of claim 1 wherein said physically depositing comprises electron beam physical vapor deposition.

13. The method of claim 1 further comprising:
    at least partially removing the backing element and machining adjacent deposited material and preexisting material of the component to create a second base surface; and
    physically depositing more of the Ti-based material atop the second base surface.

14. The method of claim 13 further comprising:
    machining said more of the Ti-based material to produce a final contour.

15. The method of claim 1 wherein:
    wherein said physically depositing said Ti-based material comprises performing physical deposition in a manner selected from the group consisting of vapor deposition, electron beam physical vapor deposition, and electron beam flash vapor deposition.

16. The method of claim 15 wherein said physically depositing is performed at a pressure between $10^{-3}$ and $10^{-6}$ torr.

17. The method of claim 15 wherein said performing said physical deposition is performed at a pressure of approximately $10^{-4}$ torr.

18. The method of claim 15 wherein said physically depositing said metal is performed at a rate between 10 and 50 micrometers per minute.

19. The method of claim 15 wherein said physically depositing said Ti-based material is performed at a rate of approximately 20 micrometers per minute.

20. The method of claim 1 wherein:
    the backing element is applied along a suction side of an airfoil of the element.

21. The method of claim 1 wherein:
    the applying places the backing element in a position to facilitate a buildup of said Ti-based material in place of the first material.

22. The method of claim 1 wherein:
    the physically depositing deposits said Ti-based material spanning the component and backing element.

* * * * *